United States Patent
Sciaini et al.

(10) Patent No.: US 11,322,330 B2
(45) Date of Patent: May 3, 2022

(54) SAMPLE HOLDER FOR ELECTRON MICROSCOPY

(71) Applicants: German Sciaini, Waterloo (CA); Ariel A. Petruk, Waterloo (CA)

(72) Inventors: German Sciaini, Waterloo (CA); Ariel A. Petruk, Waterloo (CA)

(*) Notice: Subject to any disclaimer, the term of this patent is extended or adjusted under 35 U.S.C. 154(b) by 0 days.

(21) Appl. No.: 17/209,491

(22) Filed: Mar. 23, 2021

(65) Prior Publication Data
US 2021/0210304 A1    Jul. 8, 2021

Related U.S. Application Data

(63) Continuation of application No. PCT/CA2019/051251, filed on Sep. 6, 2019.

(60) Provisional application No. 62/765,934, filed on Sep. 24, 2018.

(51) Int. Cl.
*H01J 37/20* (2006.01)
*F25B 9/02* (2006.01)
*F25D 19/00* (2006.01)
*H01J 37/26* (2006.01)

(52) U.S. Cl.
CPC .............. *H01J 37/20* (2013.01); *F25B 9/02* (2013.01); *F25D 19/003* (2013.01); *H01J 37/26* (2013.01); *F25B 2309/02* (2013.01); *H01J 2237/2001* (2013.01)

(58) Field of Classification Search
CPC .... H01J 37/20; H01J 37/26; H01J 2237/2001; F25B 9/02; F25B 2309/02; F25D 19/003; F25D 19/006
USPC .................................................... 250/443.1
See application file for complete search history.

(56) References Cited

U.S. PATENT DOCUMENTS

2006/0255290 A1* 11/2006 Bhadare .................. H01J 37/02
                                                        250/443.1
2007/0234751 A1   10/2007 Nagamune
2009/0019862 A1    1/2009 Noe et al.

FOREIGN PATENT DOCUMENTS

GB            2197981 A       6/1988

OTHER PUBLICATIONS

International Search Report dated Nov. 14, 2019, Application No. PCT/CA2019/051251.

* cited by examiner

*Primary Examiner* — Kiet T Nguyen
(74) *Attorney, Agent, or Firm* — The Dobrusin Law Firm, PC

(57) ABSTRACT

The apparatus is for use with an electron microscope, a sample, a source of high pressure gas and a vacuum pump system. The apparatus includes a holder part a body part and a Joule-Thomson refrigerator. The holder part is adapted to receive the sample and adapted to present the sample to the microscope for inspection in use. The body part defines a cavity, the cavity being evacuated by the vacuum pump system for use. The refrigerator is disposed within the cavity and thermally-coupled to the holder part, the refrigerator being coupled in use to the source of high pressure gas to maintain the sample at about a predetermined temperature.

9 Claims, 11 Drawing Sheets

NOT TO SCALE

NOT TO SCALE

NOT TO SCALE

NOT TO SCALE

NOT TO SCALE

NOT TO SCALE

SAMPLE HOLDER FOR ELECTRON MICROSCOPY

FIELD

The invention relates to the field of electron microscopy.

BACKGROUND

In the field of electron microscopy, it is known to cool a sample by thermally coupling a supply of liquid nitrogen to the receptacle in which the sample is housed.

SUMMARY

Forming one aspect of the invention is apparatus for use with an electron microscope, a sample, a source of high pressure gas and a vacuum pump system, the apparatus comprising: a holder part adapted to receive the sample and adapted to present the sample to the microscope for inspection in use; a body part defining a cavity, the cavity being evacuated by the vacuum pump system for use; and a Joule-Thomson refrigerator disposed within the cavity and thermally-coupled to the holder part, the refrigerator being coupled in use to the source of high pressure gas to maintain the sample at about a predetermined temperature.

According to another aspect, the holder part can comprise a sampling end, the sampling end being adapted to receive the sample.

According to another aspect, the apparatus can further comprise a conductor, the refrigerator being thermally-coupled to the sampling end by the conductor.

According to another aspect, the conductor can be flexible.

According to another aspect, the body part can be releasably coupled to the holder part and coupled to the refrigerator, the conductor being sized and dimensioned to permit, if the body part and the holder part are separated and operatively positioned, connection of the conductor to one or more of the body part and the holder part.

According to another aspect, the apparatus can further comprise a screw-operated lamp operatively connected to the refrigerator and adapted to permit said connection of the conductor.

According to another aspect, the holder part can comprise an insulator having a passage and constructed of thermally insulating material, the refrigerator and the sampling end being thermally coupled via the passage.

Advantages, features and characteristics of the invention will become apparent upon review of the following detailed description with reference to the appended drawings, the latter being briefly described hereinafter.

DETAILED DESCRIPTION

Figure 1:
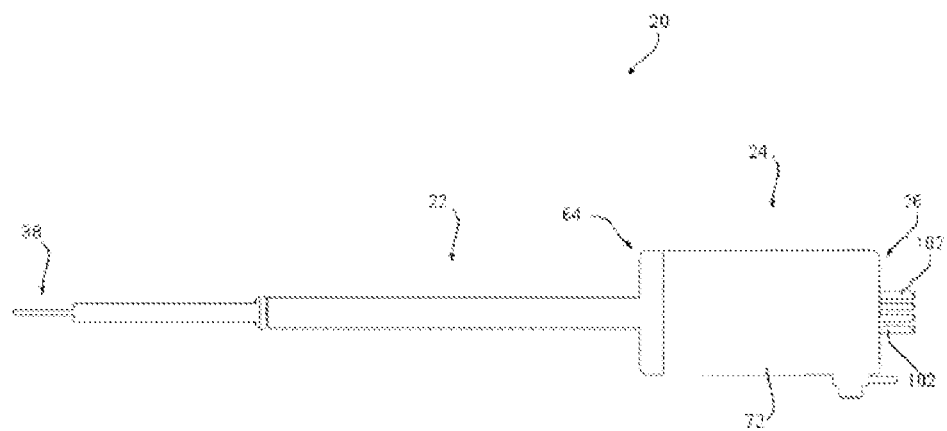
FIG. 1 is a side view of apparatus according to an embodiment of the invention.
Figure 2:
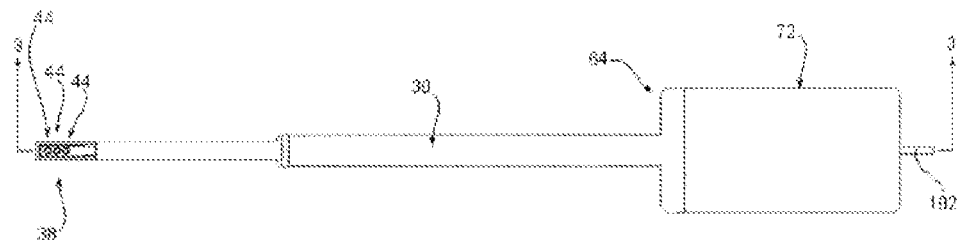
FIG. 2 is a top view of the apparatus of FIG. 1.
Figure 3:
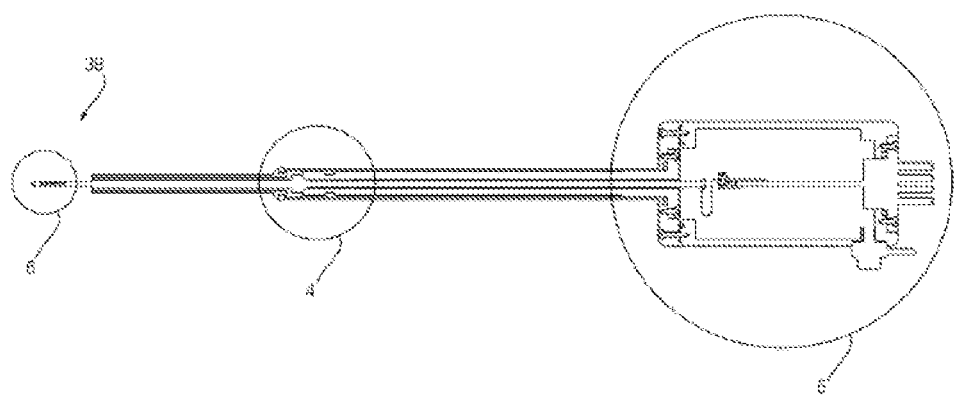
FIG. 3 is a view along section 3-3 of FIG. 2.
Figure 4:
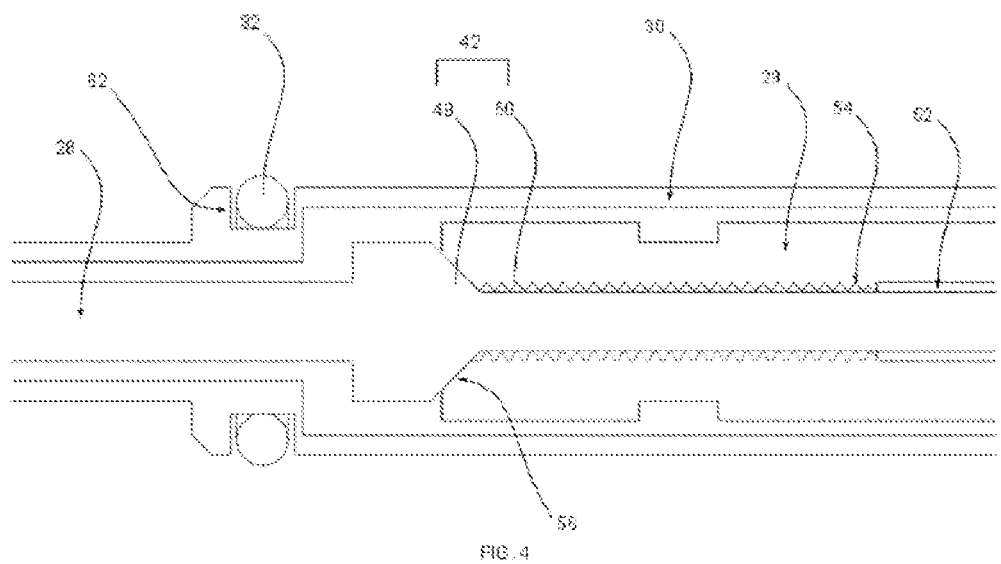
FIG. 4 is an enlarged view of encircled area 4 of FIG. 3.
Figure 5:
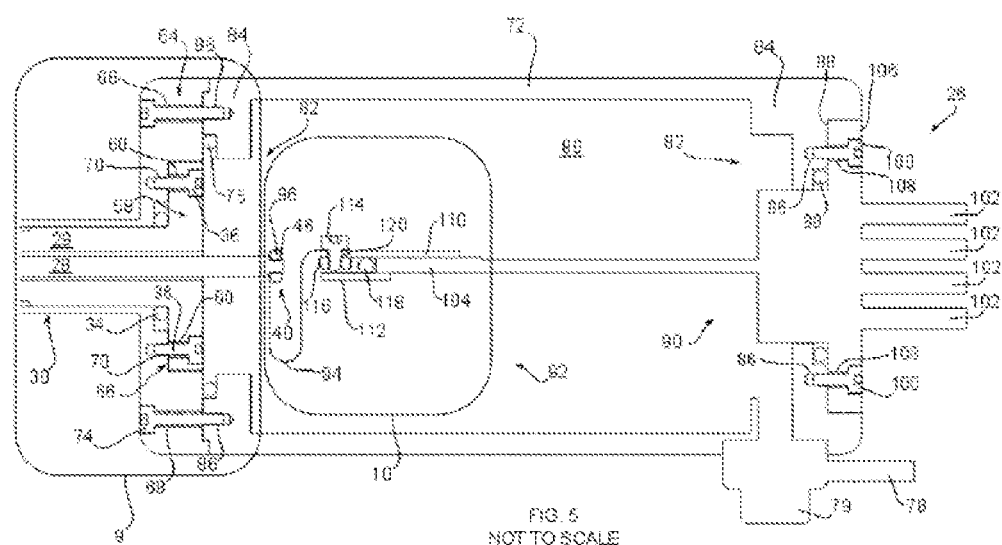
FIG. 5 is an enlarged view of encircled area 5 of FIG. 3.
Figure 6:
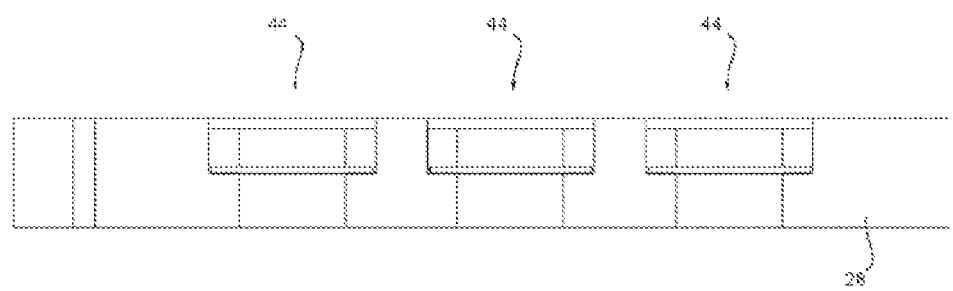
FIG. 6 is an enlarged view of encircled area 6 of FIG. 3.

An embodiment 20 of the invention: is shown in FIGS. 1-6; will be understood to be used with an electron microscope, a sample, a source of high pressure nitrogen gas and a vacuum pump system; and will be seen to include a holder part 22, a body part 24 and a refrigeration part 26.

Holder Part

The holder part 22 will be seen to include a rod 28, an insulator 23, a casing 30, a shaft seal 32, a flange seal 34 and a plurality of bolts 36.

The rod 28 is oxygen-free copper and has a sampling end 38, a terminal end 40 and a central portion 42. The sampling end 38 has defined therein three recesses 44 adapted to suit standard 3 mm diameter copper meshes. The terminal end 40 is provided with threads 46. The central portion 42 extends from the sampling end 38 to the terminal end 40 and includes a frustoconical portion 48 and an externally threaded portion 50, the threaded portion 50 being intermediate the frustoconical portion 48 and the terminal end 40.

The insulator 29 is constructed of thermally insulating material and has: a passage, more particularly, a central bore 52 in which the rod 28 is positioned such that the sampling end 38 protrudes therefrom; a threaded central portion 54 in receipt of the threaded portion 50 of rod 28; a frustoconical mouth 56 sealingly receiving the frustoconical portion 48 of the rod 28; and a flanged end 58 through which protrudes the threaded terminal end 40 of the rod and which has throughbores 60 defined therethrough.

The casing 30 is hollow and has: the sampling end 38 protruding through one end; a peripheral groove 62; and a flanged end 64. The flanged end 64 has a recess 66 defined therein, throughbores 68 defined therethrough and threaded sockets 70 defined therein, the recess 66 being in receipt of the flanged end 58 of the insulator.

The shaft seal 2 is an O-ring disposed in the peripheral groove 62.

The flange seal 34 is an O-ring disposed between the flanged end 58 of the insulator and the flanged end 64 of the casing to provide for a hermetic seal therebetween.

The bolts 36 pass through the throughbores f the insulator and n the threaded sockets 70 of the casing to rigidly connect the same.

Body Part

The body part 24 incudes a shell 72, a plurality of bolts 74 and a body seal 76.

The shell 72 is tubular and defines a port 78 with a shut-off valve 79 and a central cavity 80 with opposed apertures 8Z each bounded by a rim 84 having threaded sockets 86 defined therein, one of the rims having a depression 88 therein.

Bolts 74 pass through throughbores 68 in flanged end 64 of the casing 30 info the threaded sockets 86 of rim 84.

The body seal 76 is an o-ring that hem t seals the rim to the flanged end 64 of the casing.

Refrigeration Part

The refrigeration part 26 includes a refrigeration mechanism 90, a clamp 92, a flexible con r 94, a joint 96, an end seal 98 and a plurality of bolts 100.

The refrigeration mechanism 90 is a Joule-Thomson refrigerator: having extending therefrom a plurality of connections 102; terminating in a cooling plate 104; operating at 125 bar nitrogen; and having a flanged end 106 having defined therethrough a plurality of throughbores 108, the flanged end being disposed in the depression 88 and the cooling plate being disposed in the cavity 80.

The clamp 92 includes a pair of plates 1143, 112, a bolt 114, a nut 116 and a member 118. The plates 110, 112 are secured to the member 118 in spaced relation to one another and are in gripping, thermally communication relation to the cooling plate 104. One of the plates 110 has a bore 120 therethrough. The bolt 114 passes through the bore 110 to the nut 116.

The flexible conductor 94 is a length of soft braid of copper sandwiched at one end between the bolt 114 and the plate 110.

The joint 96 is a bolt to which the flexible conductor extends and is securely connected in thermally conductive relation thereto, the joint 96 being threadingly connected to the terminal end 40 of the rod 28.

The end seal 99 is disposed between the flanged end 108 of the refrigerator a the rim 84 of the shell 72 and provides a hermetic seal therebetween.

The bolts 100 pass through the throughbores 108 into threaded sockets 86 and securely connect the refrigerator 90 to rim 84 of the shell 72.

Cryogenic Use

In cryogenic use (not shown), the gas supply is coupled to the connections 102 to provide high pressure gas to the refrigerator to produce the cooling necessary to maintain cryogenic conditions of the specimen. The necessary vacuum environment in the cavity [<$10^{-6}$ bar] is attained by connecting port 78 to a vacuum pump system. (it will be understood that the vacuum pump system need not necessarily be connected or in operation when refrigerator is working; the chamber 80 can be isolated from the vacuum pump system via shut off valve 79).

Experimental

Scanning tunneling microscopy images of a sample positioned on the cooling plate 104 of a Joule-Thomson refrigerator 90 showed sub-nanometer resolution, thereby demonstrates minimal vibration in the longitudinal direction. This is probative of the utility of the Joule-Thomson refrigerator in the present context when coupled with a conductor adapted to resist translation of vibration, at least in the transverse direction.

Advantages

Persons of ordinary skill will readily appreciate that the foregoing structure provides significant advantages, including: no temperature drift associated with evaporation of liquid nitrogen in a Dewar flask, no vibration associated with liquid nitrogen bubbles; no limitations upon rotation/angle of the sample; relatively fast cool-down and warm up time [<15 min]; and relatively low cost operation.

Variants

Figure 7:
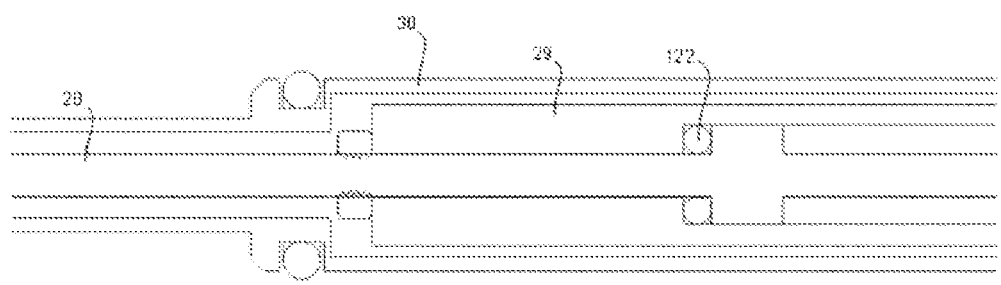
FIG. 7 is a vi f an alternate embodiment the structure of FIG. 4
Figure 8:
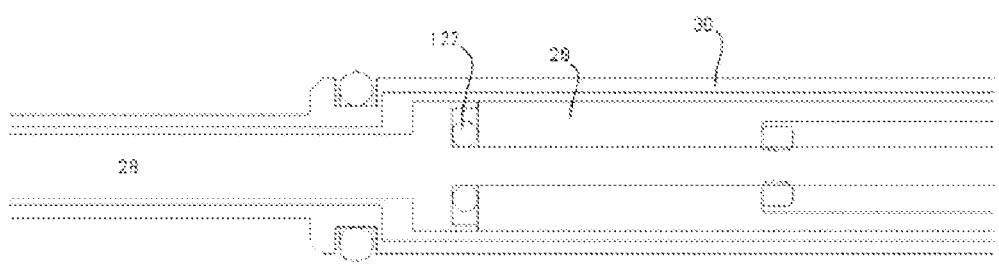
FIG. 8 is a view of another embodiment of the structure of FIG. 4.

The rod can be sealed to the insulator, for example, by an o-ring 122, as shown in FIG. 7 and FIG. 8.

Figure 9:
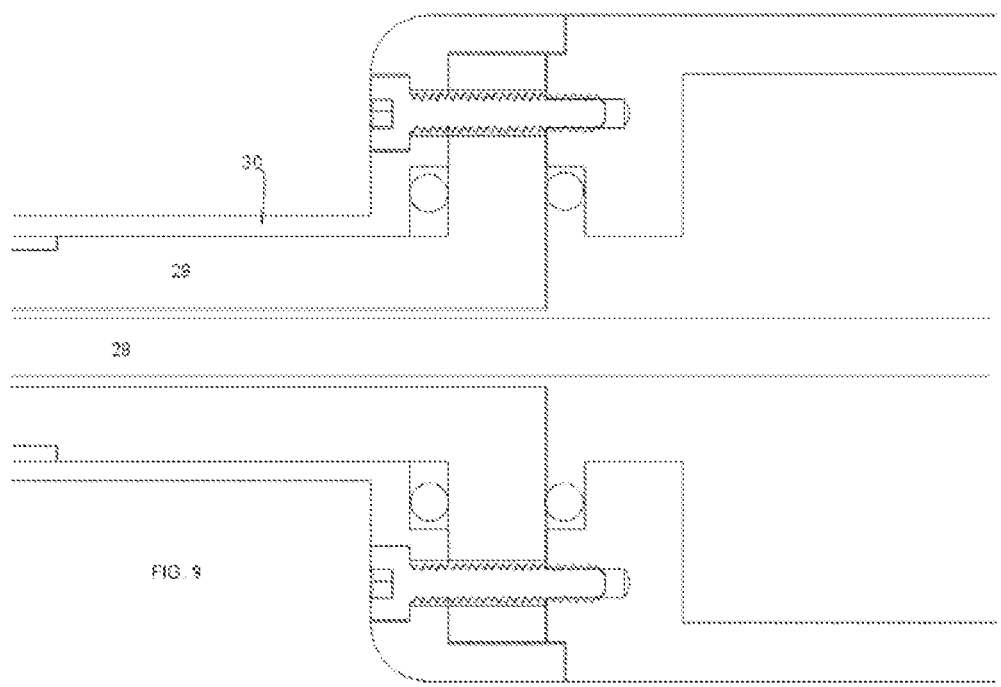
FIG. 9 is a view of another embodiment of the structure of encircled area 9 of FIG. 5.

The bolts coupling the casing to the insulator can also be omitted, as indicated by FIG. 9.

Figure 10:
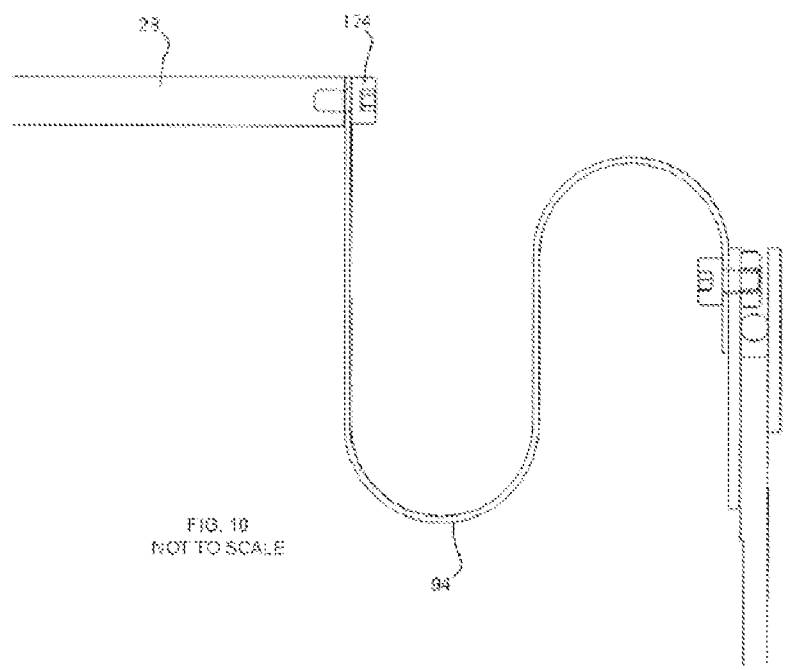
FIG. 10 is a view another embodiment of the structure of encircled area 10 of FIG. 5.
Figure 11:
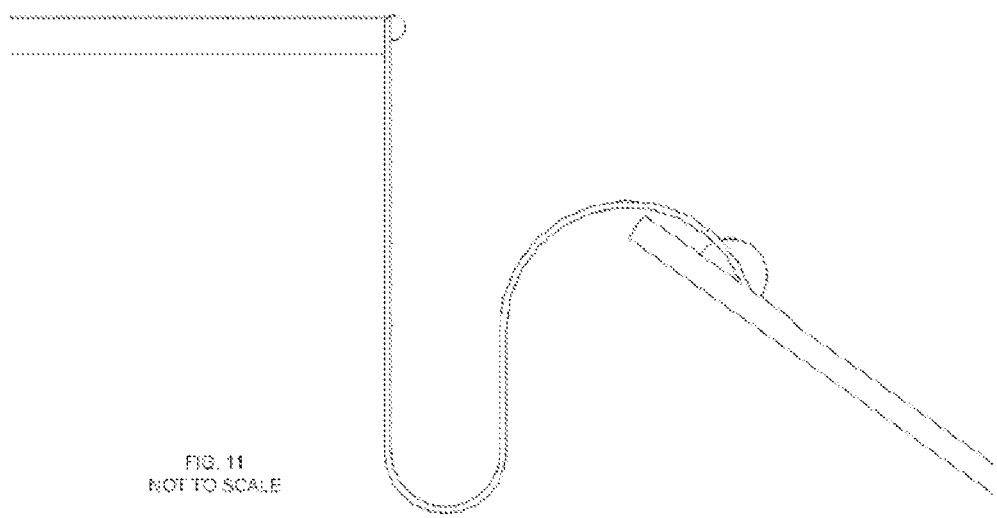
FIG. 11 is a view of another embodiment of the structure of encircled area 10 of FIG. 5.

The terminal end of the rod can be provided with an internal, rather than an external thread, to permit connection of the conductor with a bolt 124, as indicated by FIG. 10. The conductor could also be soldered or glued at each, end, as shown in FIG. 11.

Further variations are possible.

For example, whereas a copper rod is specified, other materials, such as aluminum, silver, etc., can be employed.

Further, whereas a seal between the rod and insulator is provided by the threaded connection therebetween and the frustoconical interface, other seals, such as glue, epoxy, etc. are possible.

The insulator could be any non-magnetic and low thermal conductivity material, such as Inconel, Ti6Al4V, poly-para-phenylene-terephthalamide, polyimide, polyamide, poly-amide-imides, polytetrafluoroethylene, etc. The insulator could also take other forms, need not include a cylindrical bore in close-fitting relation to the rod and need not be formed entirely cut of low thermal conductivity material.

Of course, whereas the holder part is specified to receive 3 mm copper meshes, the holder part could be modified to accept other supports; and it could also have less or more than three recesses.

Gases other than nitrogen can be used, such as argon, methane, etc. Gas mixtures can also be used, as can gas at pressures other than 125 bar.

The conductor need not be braided, need not be copper and need not be completely or partially flexible.

The shell need not be tubular.

The rod and refrigerator could be oriented at any angle.

The apparatus can be used at temperatures other than cryogenic, temperatures as low as about 10K can be achieved with a Joule-Thomson refrigerator and heating is also possible in relatively high temperature conditions by the use of electrical connections, i.e up to about 500K.

The holder part and body part need not be separate and could be constructed integrally.

Whereas a vacuum pump system is mentioned, it will be understood that this term should be understood to encompass any structure capable of functioning in the manner of a vacuum pump to evacuate the chamber and need not even include a pump.

Accordingly, the invention will be understood to be limited only by the accompanying purposively construed.

The invention claimed is:

1. Apparatus for use with an electron microscope, a sample, a source of high pressure gas and a vacuum pump system, the apparatus comprising:
    a holder part adapted to receive the sample and adapted to present the sample to the microscope for inspection in use;
    a body part defining a cavity, the cavity being evacuated by the vacuum pump system for use; and
    a Joule-Thomson refrigerator disposed within the cavity and thermally-coupled to the holder part, the refrigerator being coupled in use to the source of high pressure gas to maintain the sample at about a predetermined temperature.

2. Apparatus according to claim 1, wherein the holder part comprises a sampling end, the sampling end being adapted to receive the sample.

3. Apparatus according to claim 2, further comprising a conductor, the refrigerator being thermally-coupled to the sampling end by the conductor.

4. Apparatus according to claim 3, wherein the conductor is flexible.

5. Apparatus according, to claim 4, wherein the body part is releasably coupled to the holder part and coupled to the refrigerator, the conductor being sized and dimensioned to permit, if the body part and the holder part are separated and operatively positioned, connection of the conductor to one or more of the body part and the holder part.

6. Apparatus according to claim 5, further comprising a screw-operated clamp operatively connected to the refrigerator and adapted to permit said connection of the conductor.

7. Apparatus according to claim 3, wherein the holder part composes an insulator having a passage and constructed of thermally insulating material, the refrigerator and the sampling end being thermally coupled via the passage.

8. Apparatus according to claim 7, wherein the refrigerator is adapted to maintain the sample in cryogenic conditions.

9. Apparatus according to claim 1, wherein the refrigerator is adapted to maintain the sample in cryogenic conditions.

* * * * *